(12) United States Patent
Seo et al.

(10) Patent No.: US 12,317,419 B2
(45) Date of Patent: May 27, 2025

(54) APPARATUS FOR TEMPERATURE MEASUREMENT AND METHOD OF PROCESSING SUBSTRATE

(71) Applicant: SEMES CO., LTD., Chungcheongnam-do (KR)

(72) Inventors: Yong Jun Seo, Gyeonggi-do (KR); Sang Hyun Son, Busan (KR); Su Jin Chae, Gyeonggi-do (KR); Dong Ok Ahn, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 472 days.

(21) Appl. No.: 17/737,354

(22) Filed: May 5, 2022

(65) Prior Publication Data
US 2023/0083574 A1  Mar. 16, 2023

(30) Foreign Application Priority Data

Sep. 13, 2021  (KR) .......................... 10-2021-0121865

(51) Int. Cl.
G01K 1/143 (2021.01)
G01K 1/18 (2006.01)
H05K 1/18 (2006.01)
H05K 1/02 (2006.01)

(52) U.S. Cl.
CPC .............. *H05K 1/181* (2013.01); *G01K 1/143* (2013.01); *G01K 1/18* (2013.01); *H05K 1/0201* (2013.01); *H05K 2201/09027* (2013.01); *H05K 2201/09063* (2013.01); *H05K 2201/10151* (2013.01)

(58) Field of Classification Search
CPC ......... H05K 1/181; H05K 2201/10151; H05K 1/0201; H05K 2201/068; H05K 2201/09027; H05K 2201/09063; G01K 1/143; G01K 1/18; H01L 21/67248
See application file for complete search history.

(56) References Cited

U.S. PATENT DOCUMENTS

| | | | |
|---|---|---|---|
| 6,190,040 B1 * | 2/2001 | Renken | ............. H01L 21/67248 374/E1.019 |
| 6,229,322 B1 * | 5/2001 | Hembree | .......... H01L 21/67248 340/584 |
| 7,419,299 B2 * | 9/2008 | Akram | .................... G01K 1/026 374/E1.005 |
| 11,841,278 B2 * | 12/2023 | Wu | ......................... G01K 11/32 |
| 2019/0250049 A1 * | 8/2019 | Harada | .................. G01K 17/00 |

FOREIGN PATENT DOCUMENTS

| | | |
|---|---|---|
| KR | 10-0789286 | 1/2008 |
| KR | 10-1709943 | 2/2017 |
| KR | 10-2024206 | 9/2019 |

* cited by examiner

*Primary Examiner* — Steven T Sawyer
(74) *Attorney, Agent, or Firm* — WOMBLE BOND DICKINSON (US) LLP

(57) ABSTRACT

A temperature measuring apparatus with improved accuracy is provided. The temperature measuring apparatus comprises a test substrate having a thermal conductivity, a circuit board layer laminated on the test substrate and including a plurality of through holes exposing a top surface of the test substrate, bonding agent disposed in the plurality of through holes and having a thermal conductivity, and a plurality of sensors disposed on the bonding agent and for measuring a temperature.

18 Claims, 9 Drawing Sheets

APPARATUS FOR TEMPERATURE MEASUREMENT AND METHOD OF PROCESSING SUBSTRATE

This application claims the benefit of Korean Patent Application No. 10-2021-0121865, filed on Sep. 13, 2021, in the Korean Intellectual Property Office, the disclosure of which is incorporated herein by reference in its entirety.

BACKGROUND

1. Field

The present disclosure relates to a temperature measuring apparatus and a substrate processing method.

2. Description of the Related Art

In general, a semiconductor device is manufactured by repeatedly performing various unit processes such as deposition, photolithography, etching, polishing, and cleaning using a substrate. Among the various processes for processing a substrate, a process of heat processing a substrate such as an etching or a baking process requires control of the temperature of the substrate. Therefore, in the process of processing the substrate, it is necessary to measure the temperature of the substrate.

As a method for measuring the temperature of the substrate, there are a substrate direct bonding method and a circuit board bonding method. The substrate direct bonding method refers to a method, in which a temperature measuring sensor is directly bonded to a substrate. The circuit board bonding method refers to a method of bonding a circuit board to a substrate and configuring a temperature sensor circuit on the circuit board.

SUMMARY

An object of the present disclosure is to provide a temperature measuring apparatus with improved accuracy.

Another object of the present disclosure is to provide a substrate processing method using a temperature measuring apparatus with improved accuracy.

The objects of the present disclosure are not limited to the objects mentioned above, and other objects not mentioned will be clearly understood by those skilled in the art from the following description.

One aspect of the temperature measuring apparatus of the present disclosure for achieving the above object comprises a test substrate having a thermal conductivity, a circuit board layer laminated on the test substrate and including a plurality of through holes exposing a top surface of the test substrate, a bonding agent disposed in the plurality of through holes and having a thermal conductivity, and a plurality of sensors disposed on the bonding agent and for measuring a temperature.

Wherein the circuit board layer comprises a first annular line having a first diameter with respect to a center of the circuit board layer, a second annular line having a second diameter greater than the first diameter with respect to a center of the circuit board layer, a first straight line passing through a center of the circuit board layer, intersecting the first annular line at first and second points, and intersecting the second annular line at third and fourth points, a second straight line intersecting the first straight line at a center of the circuit board layer, intersecting the first annular line at fifth and sixth points, and intersecting the second annular line at seventh and eighth points, wherein the plurality of through holes are disposed at the center and the first to eighth points.

Wherein the circuit board layer comprises an air gap formed by at least two or more of the first annular line, the second annular line, the first straight line, and the second straight line, and the air gap exposes a top surface of the test substrate.

Wherein a coefficient of thermal expansion of the circuit board layer is greater than a coefficient of thermal expansion of the test substrate.

Wherein the bonding agent comprises an elastic bonding agent.

Wherein the plurality of through holes correspond one-to-one with the plurality of sensors.

Wherein the bonding agent is in contact with an upper surface of the test substrate and lower ends of the plurality of sensors.

Wherein the thermal conductivity of the bonding agent is greater than or equal to the thermal conductivity of the test substrate.

One aspect of the substrate processing apparatus of the present disclosure for achieving the above anther object comprises providing a temperature measuring apparatus for measuring a temperature of a test substrate on a heater in a chamber for providing a space for processing a process substrate, measuring a temperature change of the test substrate using the temperature measuring apparatus, removing the temperature measuring apparatus from the heater, disposing the process substrate on the heater, and baking the process substrate, wherein the temperature measuring apparatus comprises a thermally conductive test substrate, a circuit board layer laminated on the test substrate and including a plurality of through holes exposing a top surface of the test substrate, a bonding agent disposed in the plurality of through holes and having a thermal conductivity, and a plurality of sensors disposed on the circuit board layer and for measuring a temperature.

Wherein a thickness of the test substrate is smaller than a thickness of the process substrate.

Wherein a thermal capacity of the test substrate is smaller than a thermal capacity of the process substrate.

Wherein the bonding agent has elasticity.

Wherein the circuit board layer comprises a first annular line having a first diameter with respect to a center, a second annular line having a second diameter greater than the first diameter with respect to the center, a first straight line passing through the center, intersecting the first annular line at first and second points, and intersecting the second annular line at third and fourth points, and a second straight line intersecting the first straight line at the center, intersecting the first annular line at fifth and sixth points, and intersecting the second annular line at seventh and eighth points, wherein the plurality of through holes are disposed at the center and the first to eighth points.

Wherein the circuit board layer comprises an air gap formed by at least two or more of the first annular line, the second annular line, the first straight line, and the second straight line, and the air gap exposes a top surface of the test substrate.

Wherein the plurality of sensors overlap the center and the first to eighth points, and are in contact with the bonding agent disposed in the plurality of through holes.

One aspect of the temperature measuring apparatus of the present disclosure for achieving the above object comprises a substrate having a thermal conductivity, a bonding layer disposed on the substrate, laminated on the substrate, and including a plurality of through holes exposing an upper surface of the substrate, an elastic bonding agent disposed in the plurality of through holes and having a thermal conductivity and elasticity, and a plurality of sensors disposed on a plurality of through holes and for measuring a temperature, wherein the bonding layer comprises a first annular line having a first diameter with respect to a center of the bonding layer, a second annular line having a second diameter greater than the first diameter with respect to the center of the bonding layer, a first straight line passing through the center of the bonding layer, intersecting the first annular line at first and second points, and intersecting the second annular line at third and fourth points, a second straight line intersecting the first straight line at the center of the bonding layer, intersecting the first annular line at fifth and sixth points, and intersecting the second annular line at seventh and eighth points, wherein the plurality of through holes are disposed at the center and the first to eighth points.

Wherein the bonding layer comprises a flexible printed circuit board (FPCB).

Wherein the elastic bonding agent is in contact with an upper surface of the substrate and lower ends of the plurality of sensors.

Wherein a coefficient of thermal expansion of the bonding layer is greater than a coefficient of thermal expansion of the substrate.

Wherein the bonding layer comprises an air gap formed by at least two or more of the first annular line, the second annular line, the first straight line, and the second straight line, and the air gap exposes an upper surface of the substrate.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
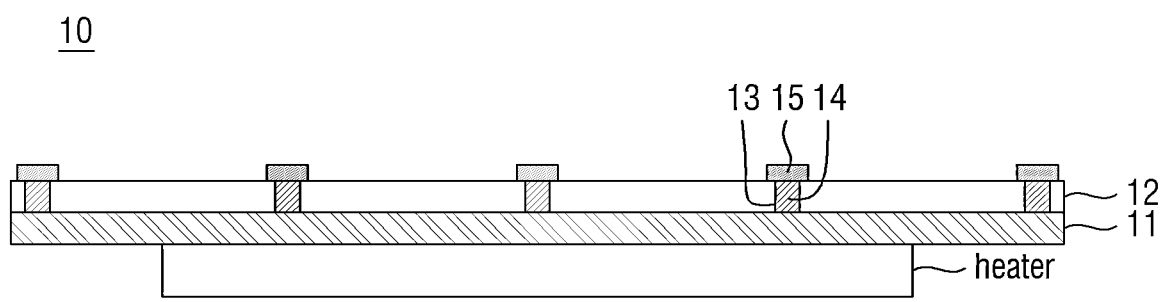
FIG. 1 is a conceptual diagram for describing a temperature measuring apparatus according to an embodiment of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings.

However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Referring to an element or layer "on" another element or layer includes not only directly on the other element or layer, but also with intervening other layers or elements. On the other hand, referring to an element "directly on" or "directly on" indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present disclosure belongs. In addition, terms defined in a commonly used dictionary are not to be interpreted ideally or excessively unless clearly specifically defined.

Hereinafter, embodiments of the present disclosure will be described in detail with reference to the accompanying drawings. In the description with reference to the accompanying drawings, the same or corresponding components are assigned the same reference numerals regardless of reference numerals, and overlapping descriptions thereof will be omitted.

Figure 2:
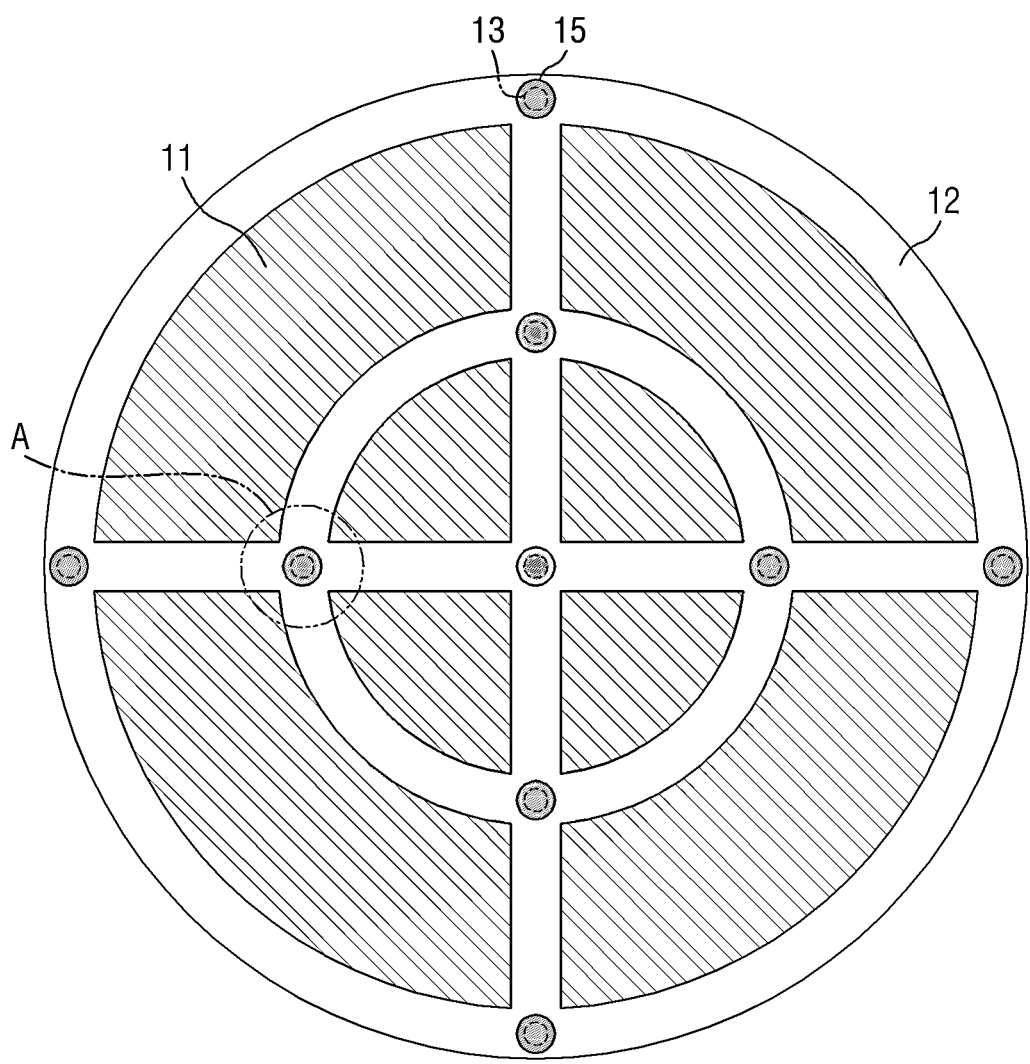
FIG. 2 is a plan view of a temperature measuring apparatus according to an embodiment of the present disclosure.
Figure 3:
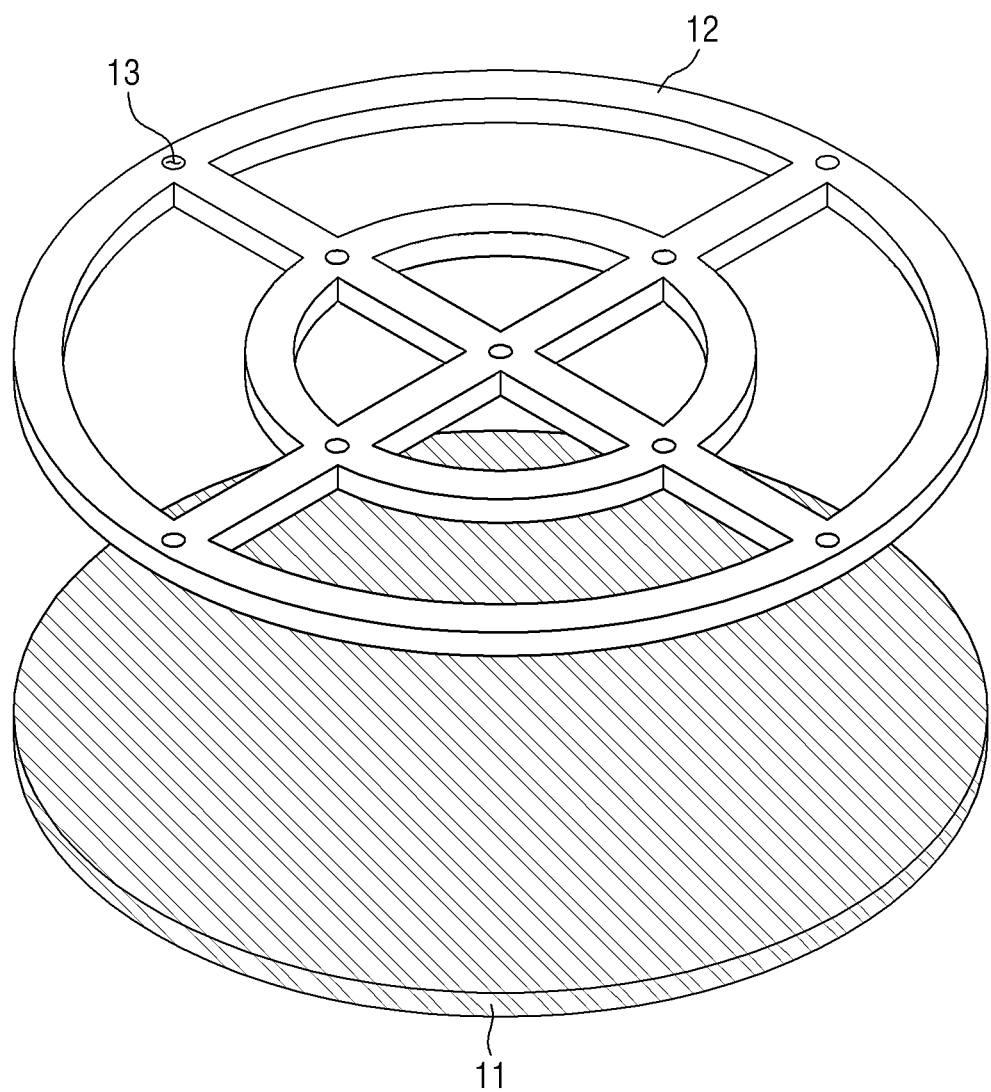
FIG. 3 is a perspective view for describing a temperature measuring apparatus according to an embodiment of the present disclosure.
Figure 4:
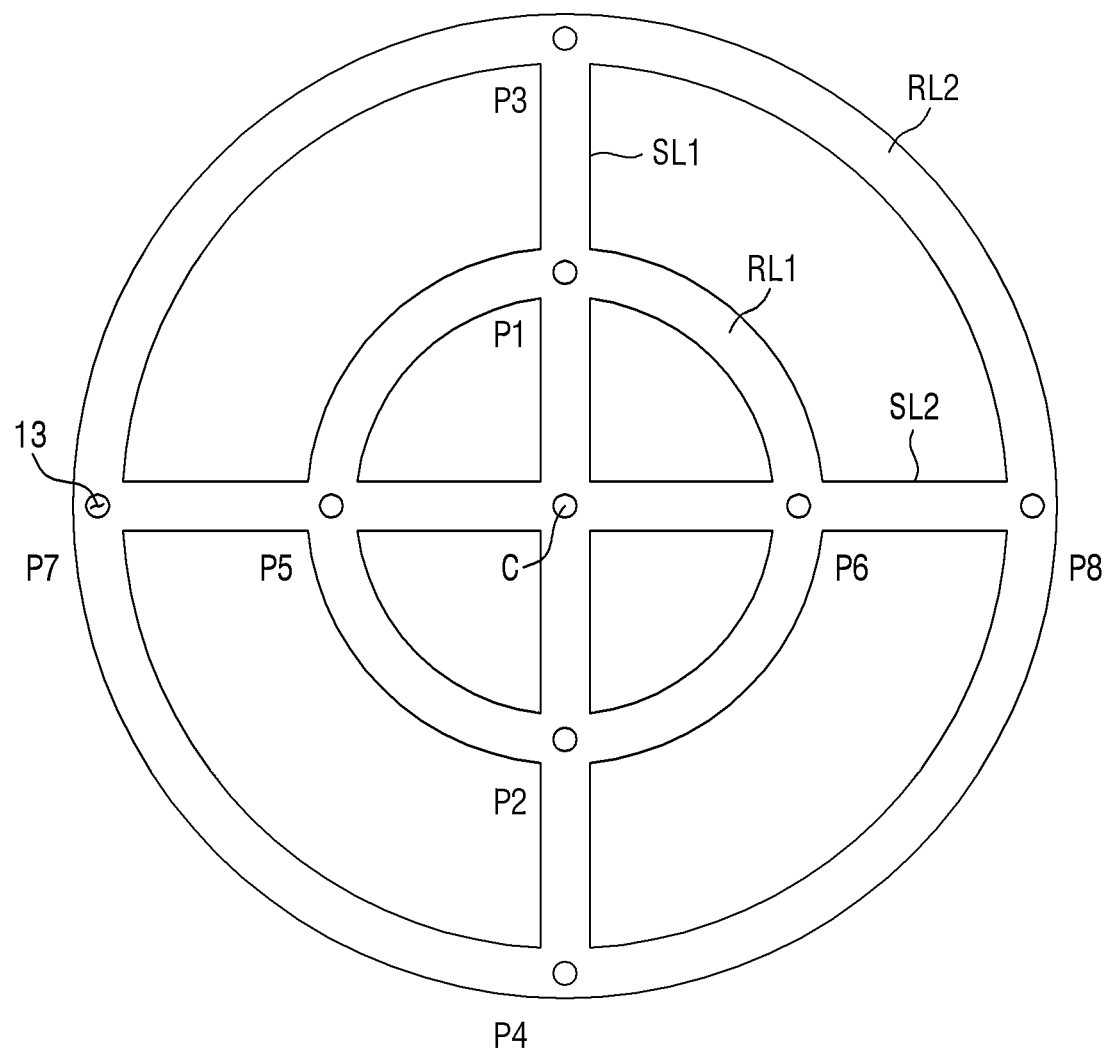
FIG. 4 is a view for describing the circuit board layer of the temperature measuring apparatus according to an embodiment of the present disclosure.

FIG. 1 is a conceptual diagram for describing a temperature measuring apparatus according to an embodiment of the present disclosure. FIG. 2 is a plan view of a temperature measuring apparatus according to an embodiment of the present disclosure. FIG. 3 is a perspective view for describing a temperature measuring apparatus according to an embodiment of the present disclosure. FIG. 4 is a view for describing a circuit board layer of a temperature measuring apparatus according to an embodiment of the present disclosure.

Referring to FIGS. 1 to 4, the temperature measuring apparatus 10 according to an embodiment comprises a test substrate 11, a circuit board layer 12, a through hole 13, a bonding agent 14, and a sensor 15.

The test substrate 11 may be disposed on a heat source to be measured using the temperature measuring apparatus 10. For example, in the case of a baking process of heating the substrate, the test substrate 11 may be disposed in contact with the heater in the chamber.

The test substrate 11 may be composed of the same components as the process substrate. By measuring the temperature using the test substrate, it is possible to simulate the temperature change of the process substrate to be processed in the actual process. In this case, the process substrate refers to a substrate different from the test substrate. The test substrate 11 may transfer heat from a heat source in contact with the lower portion of the test substrate 11 to the circuit board layer 12 on the test substrate 11. That is, the test substrate 11 has a thermal conductivity.

The circuit board layer 12 is an intermediate layer for bonding the sensor 15 for measuring the temperature of the test substrate 11 on the test substrate 11. Accordingly, the circuit board layer 12 may also be referred to as a bonding layer 12. Specifically, the circuit board layer 12 may include a configuration for transferring heat received from a heat source transmitted by the test substrate 11 to the sensor 15. Accordingly, the circuit board layer 12 may have a thermal conductivity. The circuit board layer 12 may include a flexible printed circuit board (FPCB).

The circuit board layer 12 may not have a disk shape but a net or spider web shape composed of a plurality of lines. Specifically, the circuit board layer 12 does not overlap the entire surface of the test substrate 11 disposed in a lower portion, but overlaps a part of the test substrate 11, and other parts of the test substrate 11 do not overlap the circuit board layer 12, and the top surface of the test substrate 11 may be exposed.

The circuit board layer 12 may include a center C, a first annular line RL1, a second annular line RL2, a first straight line SL1, and a second straight line SL2.

The center C of the circuit board layer 12 may include a point overlapping the center point of the test substrate 11.

The first annular line RL1 of the circuit board layer 12 may include an annular line having a first diameter from the center C. Specifically, the first annular line RL1 may include a ring-shaped line surrounding the center C.

The second annular line RL2 of the circuit board layer 12 may include an annular line having a second diameter greater than the first diameter of the first annular line RL1 from the center C. That is, the second annular line RL2 may surround the first annular line RL1. The first annular line RL1 and the second annular line RL2 may be arranged in the form of concentric circles.

The first straight line SL1 of the circuit board layer 12 may include a straight line passing through the center C. The first straight line SL1 may include a line extending to the same length as the diameter of the test substrate 11. The first straight line SL1 may intersect the first annular line RL1 at the first point P1 and the second point P2. The first straight line SL1 may intersect the second annular line RL2 at the third point P3 and the fourth point P4.

The second straight line SL2 of the circuit board layer 12 may include a straight line passing through the center C. The second straight line SL2 may include a line extending to the same length as the diameter of the test substrate 11. The second straight line SL2 may vertically intersect the first straight line SL1. The second straight line SL2 may intersect the first straight line SL1 at the center C.

The second straight line SL2 may intersect the first annular line RL1 at the fifth point P5 and the sixth point P6. The second straight line SL2 may intersect the second annular line RL2 at the seventh point P7 and the eighth point P8.

A portion of the circuit board layer 12 excluding the first annular line RL1, the second annular line RL2, the first straight line SL1, and the second straight line SL2 may include an air gap. In this case, the air gap may refer to an open empty space. Specifically, the circuit board layer 12 has a net or spider web shape formed of a first annular line RL1, a second annular line RL2, a first straight line SL1, and a second straight line SL2, and parts other than the first annular line RL1, the second annular line RL2, the first straight line SL1, and the second straight line SL2 may be empty spaces. In the circuit board layer 12, the air gap excluding the first annular line RL1, the second annular line RL2, the first straight line SL1 and the second straight line SL2 may expose the upper surface of the test substrate 11 disposed below the circuit board layer 12.

The circuit board layer 12 includes a plurality of through holes 13. The plurality of through holes 13 may pass through the circuit board layer 12. That is, the height of the plurality of through holes 13 may be the same as the thickness of the circuit board layer 12.

The plurality of through holes 13 bond the test substrate 11 and the circuit board layer 12 and may provide a space for accommodating the bonding agent 14 for connecting the test substrate 11 and the sensor 15 through the circuit board layer 12. That is, the plurality of through holes 13 may include the bonding agent 14 inside the through holes 13.

The plurality of through holes 13 may be disposed in the first annular line RL1, the second annular line RL2, the first straight line SL1, and the second straight line SL2. The plurality of through holes 13 may be disposed at the center C of the circuit board layer 12, and at first to eighth points P1 to P8.

The bonding agent 14 may be disposed in the plurality of through holes 13. The bonding agent 14 may fill the plurality of through holes 13. The bonding agent 14 may be in contact with the upper surface of the test substrate 11 and the lower end of the sensor 15 in the plurality of through holes 13. The bonding agent 14 may connect the test substrate 11, the circuit board layer 12, and the sensor 15.

The bonding agent 14 has a thermal conductivity. The bonding agent 14 may be provided from a heat source and transfer heat transferred through the test substrate 11 to the sensor 15.

The bonding agent 14 may include an elastic bonding agent. That is, the bonding agent 14 may have elasticity. This will be described in detail below with reference to FIG. 7.

The sensor 15 may measure the temperature. Specifically, the sensor 15 does not directly measure the temperature of the test substrate 11, but may measure the temperature using the heat transferred through the bonding agent 14 disposed in the plurality of through holes 13 of the circuit board layer 12 from the test substrate 11. That is, the sensor 15 may indirectly measure the temperature of the test substrate 11 using heat transferred through the bonding agent 14, rather than directly measuring the temperature of the test substrate 11 itself.

The sensor 15 may be disposed on the plurality of through holes 13 of the circuit board layer 12. Specifically, the sensor 15 may be disposed on the bonding agent 14 disposed in the plurality of through holes 13 of the circuit board layer 12. The lower end of the sensor 15 may be in contact with the upper end of the bonding agent 14.

The sensor 15 may be disposed on the first annular line RL1, the second annular line RL2, the first straight line SL1, and the second straight line SL2. The sensor 15 may be disposed on the center C of the circuit board layer 12 and the first to eighth points P1-P8. That is, the sensor 15 may correspond one-to-one with the plurality of through holes 13 of the circuit board layer 12. The number of sensors 15 and the number of the plurality of through holes 13 disposed in the circuit board layer 12 may be the same.

Figure 5:
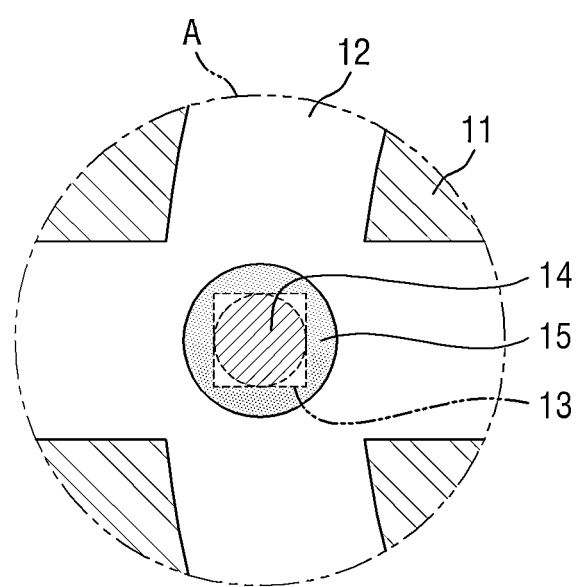
FIGS. 5 and 6 are enlarged views illustrating A of FIG. 2.
Figure 6:
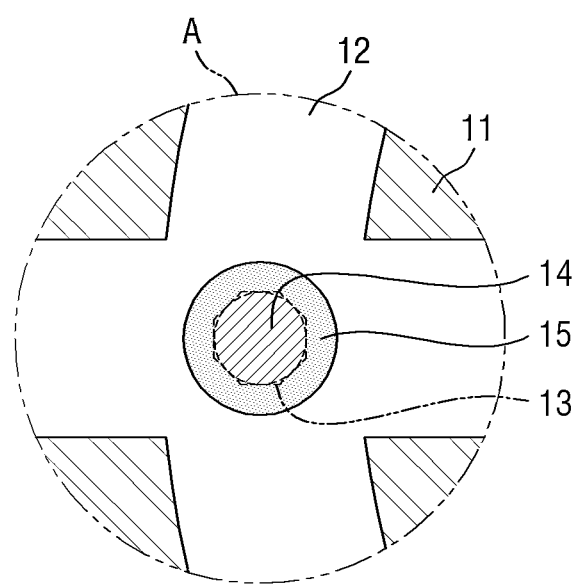

FIGS. 5 and 6 are enlarged views illustrating A of FIG. 2.

Referring to FIGS. 5 and 6, a bonding agent 14 may be filled in the through hole 13 disposed in the circuit board layer 12. The cross section of the bonding agent 14 and the cross section of the through hole 13 may not match. That is, the bonding agent 14 may not completely fill the cross section of the through hole 13. A cross section of a portion in the through hole 13 not filled with the bonding agent 14 may expose the upper surface of the test substrate 11.

The test substrate 11, the circuit board layer 12, and the sensor 15 may be sequentially laminated in a direction perpendicular to the test substrate 11. Specifically, the test substrate 11, the bonding agent 14 and the sensor 15 disposed in the plurality of through holes 13 of the circuit board layer 12 may be sequentially laminated.

The cross section of the sensor 15 may be larger than that of the bonding agent 14 filled in the through hole 13. The sensor 15 may completely cover the upper surface of the bonding agent 14. That is, the sensor 15 may cover the upper surface of the bonding agent 14 exposed on the upper surface of the circuit board layer 12. Also, a cross section of the sensor 15 may be larger than a cross section of the through hole 13. The sensor 15 may completely cover the cross section of the through hole 13. That is, the diameter of the sensor 15 is larger than the diameter of the through hole 13.

The shape of the cross section of the plurality of through holes 13 may be changed according to the embodiment. For example, as shown in FIG. 5, the cross section of the through hole 13 may include a rectangular shape. For another example, as shown in FIG. 6, the cross section of the through hole 13 may include a polygonal shape (shown as an octagon in FIG. 6) rather than a rectangle.

According to the shape of the cross section of the through hole 13, the ratio of the cross section of the bonding agent 14 among the cross section of the through hole 13 may vary. For example, comparing FIGS. 5 and 6, when the cross section of the through hole 13 is an octagon rather than a rectangle, the ratio of the cross section of the bonding agent 14 among the cross sections of the through hole 13 is higher. However, this is an example for description, and the embodiment is not limited thereto.

FIGS. 5 and 6 show that the bonding agent 14 does not completely fill the through hole 13, but the embodiment is not limited thereto. For example, the bonding agent 14 may completely fill the inside of the through hole 13. That is, the cross section of the bonding agent 14 and the cross section of the through hole 13 may match.

Figure 7:
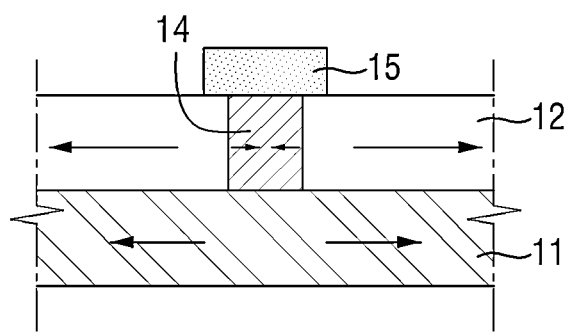
FIG. 7 is a view for describing a temperature measuring apparatus according to an embodiment of the present disclosure.

FIG. 7 is a view for describing a temperature measuring apparatus according to an embodiment of the present disclosure.

Referring to FIG. 7, the bonding agent 14 may compensate for the expansion of the test substrate 11 and the circuit board layer 12 having different thermal expansion coefficients to different degrees due to heat.

The test substrate 11 and the circuit board layer 12 may expand due to heat received from the heat source. The test substrate 11 has a lower coefficient of thermal expansion than that of the circuit board layer 12, so that it may expand less than the circuit board layer 12. The circuit board layer 12 has a higher coefficient of thermal expansion than that of the test substrate 11, so that it can expand more than the test substrate 11.

The elastic bonding agent 14 may compensate for a difference in thermal expansion coefficient between the test substrate 11 and the circuit board layer 12. Due to the elasticity of the bonding agent 14, it is possible to offset the expansion of the circuit board layer 12 more than the test substrate 11.

The elasticity of the bonding agent 14 may prevent a gap between the test substrate 11 and the circuit board layer 12 from being generated or the test substrate or the circuit board layer 12 from being warped, due to the test substrate 11 and the circuit board layer 12 expanding with different coefficients of thermal expansion.

Figure 8:
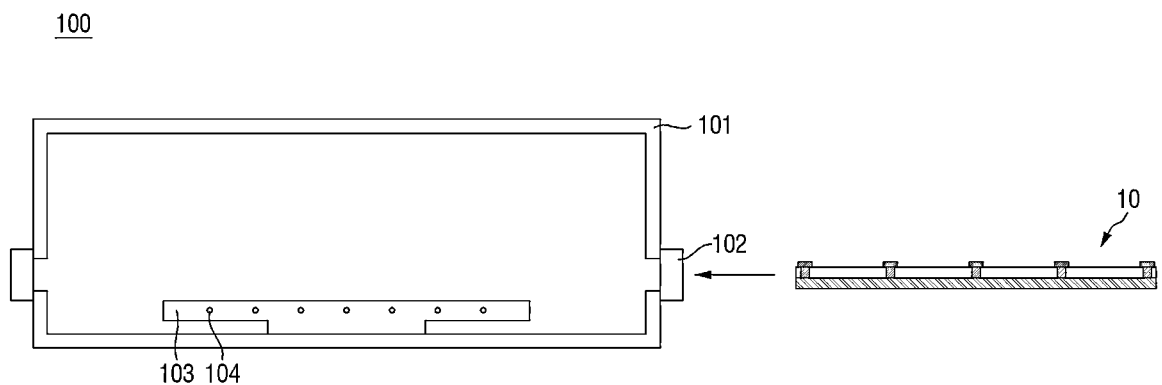
FIGS. 8 and 9 are diagrams for describing a substrate processing method using a temperature measuring apparatus according to an embodiment of the present disclosure.
Figure 9:
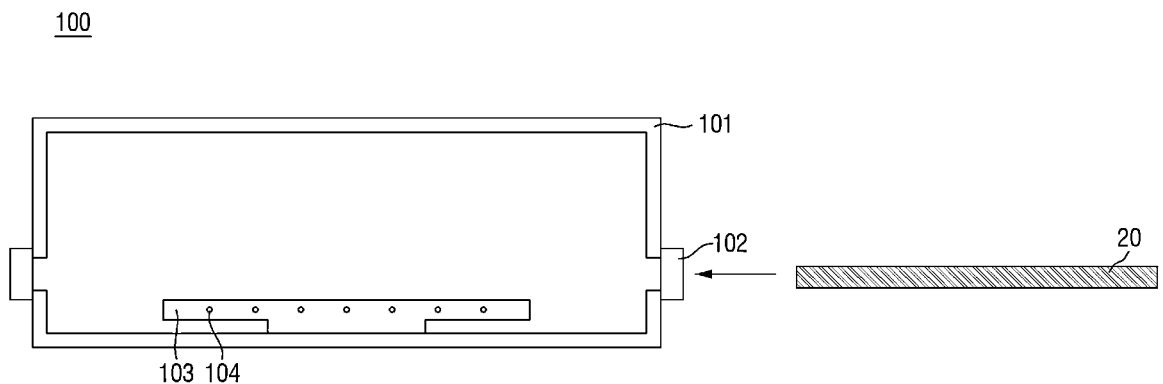

FIGS. 8 and 9 are diagrams for describing a substrate processing method using a temperature measuring apparatus according to an embodiment of the present disclosure.

Referring to FIGS. 8 and 9, the temperature measuring apparatus 10 according to an embodiment may be provided in the substrate processing apparatus 100.

The substrate processing apparatus 100, in which a temperature is measured using the temperature measuring apparatus 10, may include a chamber 101, a door 102, a substrate support unit 103, and a heater 104.

The chamber 101 forms a space for processing the process substrate 20. A substrate entrance may be formed on a sidewall of the chamber 101. The substrate entrance may be opened and closed by the door 102.

The substrate support unit 103 may support the temperature measuring apparatus 10 or the process substrate 20 in the processing space formed by the chamber 101. The substrate support unit 103 includes a heater 104.

The heater 104 may heat the temperature measuring apparatus 10 or the process substrate 20 supported by the substrate support unit 103.

The temperature measuring apparatus 10 may be provided in the chamber 101 of the substrate processing apparatus 100 and placed on the substrate support unit 103. The temperature measuring apparatus 10 may measure a change in temperature of the test substrate 11 receiving heat by the heater 104 on the substrate support unit 103.

The sensor 15 of the temperature measuring apparatus 10 may measure the temperate using heat transferred from the heater 104 through the test substrate 11 and the bonding agent 14 disposed in the through hole 13 of the circuit board layer 12.

When it is determined that the temperature change measured by the temperature measuring apparatus 10 matches the target temperature change of the process substrate 20, the temperature measuring apparatus 10 is removed from the substrate processing apparatus 100, and the process substrate 20 may be provided to the substrate processing apparatus 100. The process substrate 20 may be placed on the substrate support unit 103 and heated by the heater 104.

The substrate processing apparatus 100 for heating the process substrate 20 using the heater 104 may include a baking chamber for baking the process substrate 20, but the embodiment is not limited thereto.

The thickness of the process substrate 20 may be greater than the thickness of the test substrate 11 of the temperature measuring apparatus 10. The temperature of the process substrate 20 may change by the heater 104 of the substrate processing apparatus 100 according to a change in target temperature measured by the temperature measuring apparatus 10. The process substrate 20 and the test substrate 11 may include the same material.

As shown in FIGS. 8 and 9, when heated for the same time by the heater 104, which is the same heat source, the temperature of the test substrate 11 itself and the process substrate 20 may change according to different graphs. However, the sensor 15 of the temperature measuring apparatus 10 does not directly measure the temperature change of the test substrate 11 itself, but measures the temperature change of the configuration including the test substrate 11, the circuit board layer 12, and the bonding agent 14. Therefore, the temperature change measured using the test substrate 11, the circuit board layer 12, and the bonding agent 14 by the temperature measuring apparatus 10 may coincide with the target temperature change of the process substrate 20.

Using the heat transferred by the configuration including all of the test substrate 11, which has an increased heat capacity than the heat capacity of the test substrate 11 itself due to the circuit board layer 12 and the bonding agent 14, the circuit board layer 12, and the bonding agent 14, the sensor 15 can measure the temperature change due to the heater 104. Accordingly, it may be set to be substantially the same as the target temperature change of the process substrate 20 thicker than the test substrate 11.

Although embodiments of the present invention have been described with reference to the above and the accompanying drawings, those of ordinary skill in the art to which the present disclosure pertains can understand that the present disclosure can be practiced in other specific forms without changing its technical spirit or essential features. Therefore, it should be understood that the embodiments described above are illustrative in all respects and not restrictive.

What is claimed is:

1. An apparatus for measuring a temperature comprising: a test substrate having a thermal conductivity; a circuit board layer stacked on the test substrate and including a plurality of through holes exposing a top surface of the test substrate; a bonding agent disposed in the plurality of through holes and having a thermal conductivity; and a plurality of sensors disposed on the bonding agent and for measuring a temperature; wherein the circuit board layer comprises, a first annular line having a first diameter with respect to a center of the circuit board layer, a second annular line having a second diameter greater than the first diameter with respect to a center of the circuit board layer, a first straight line passing through a center of the circuit board layer, intersecting the first annular line at first and second points, and intersecting the second annular line at third and fourth points, and a second straight line intersecting the first straight line at a center of the circuit board layer, intersecting the first annular line at fifth and sixth points, and intersecting the second annular line at seventh and eighth points, wherein the plurality of through holes are disposed at the center and the first to eighth points.

2. The apparatus of claim 1, wherein the circuit board layer comprises an air gap formed by at least two or more of the first annular line, the second annular line, the first straight line, and the second straight line, wherein the air gap exposes a top surface of the test substrate.

3. The apparatus of claim 1, wherein a coefficient of thermal expansion of the circuit board layer is greater than a coefficient of thermal expansion of the test substrate.

4. The apparatus of claim 1, wherein the bonding agent comprises an elastic bonding agent.

5. The apparatus of claim 1, wherein the plurality of through holes correspond one-to-one with the plurality of sensors.

6. The apparatus of claim 1, wherein the bonding agent is in contact with an upper surface of the test substrate and lower ends of the plurality of sensors.

7. The apparatus of claim 1, wherein the thermal conductivity of the bonding agent is greater than or equal to the thermal conductivity of the test substrate.

8. A method for processing a substrate comprising: providing a temperature measuring apparatus for measuring a temperature of a test substrate on a heater in a chamber for providing a space for processing a process substrate, measuring a temperature change of the test substrate using the temperature measuring apparatus, removing the temperature measuring apparatus from the heater, disposing the process substrate on the heater, and baking the process substrate, wherein the temperature measuring apparatus comprises, a thermally conductive test substrate, a circuit board layer stacked on the test substrate and including a plurality of through holes exposing a top surface of the test substrate, a bonding agent disposed in the plurality of through holes and having a thermal conductivity, and a plurality of sensors disposed on the circuit board layer and for measuring a temperature; wherein the circuit board layer comprises, a first annular line having a first diameter with respect to a center, a second annular line having a second diameter greater than the first diameter with respect to the center, a first straight line passing through the center, intersecting the first annular line at first and second points, and intersecting the second annular line at third and fourth points, and a second straight line intersecting the first straight line at the center, intersecting the first annular line at fifth and sixth points, and intersecting the second annular line at seventh and eighth points, wherein the plurality of through holes are disposed at the center and the first to eighth points.

9. The method of claim 8, wherein a thickness of the test substrate is smaller than a thickness of the process substrate.

10. The method of claim 8, wherein a thermal capacity of the test substrate is smaller than a thermal capacity of the process substrate.

11. The method of claim 8, wherein the bonding agent has elasticity.

12. The method of claim 8, wherein the circuit board layer comprises an air gap formed by at least two or more of the first annular line, the second annular line, the first straight line, and the second straight line, wherein the air gap exposes a top surface of the test substrate.

13. The method of claim 8, wherein the plurality of sensors overlap the center and the first to eighth points, and are in contact with the bonding agent disposed in the plurality of through holes.

14. An apparatus for measuring a temperature comprising:
a substrate having a thermal conductivity;
a bonding layer disposed on the substrate, laminated on the substrate, and including a plurality of through holes exposing an upper surface of the substrate;

an elastic bonding agent disposed in the plurality of through holes and having a thermal conductivity and elasticity; and a plurality of sensors disposed on a plurality of through holes and for measuring a temperature, wherein the bonding layer comprises, a first annular line having a first diameter with respect to a center of the bonding layer;

a second annular line having a second diameter greater than the first diameter with respect to the center of the bonding layer;

a first straight line passing through the center of the bonding layer, intersecting the first annular line at first and second points, and intersecting the second annular line at third and fourth points;

a second straight line intersecting the first straight line at the center of the bonding layer, intersecting the first annular line at fifth and sixth points, and intersecting the second annular line at seventh and eighth points, wherein the plurality of through holes are disposed at the center and the first to eighth points.

15. The apparatus of claim 14, wherein the bonding layer comprises a flexible printed circuit board (FPCB).

16. The apparatus of claim 14, wherein the elastic bonding agent is in contact with an upper surface of the substrate and lower ends of the plurality of sensors.

17. The apparatus of claim 14, wherein a coefficient of thermal expansion of the bonding layer is greater than a coefficient of thermal expansion of the substrate.

18. The apparatus of claim 14, wherein the bonding layer comprises an air gap formed by at least two or more of the first annular line, the second annular line, the first straight line, and the second straight line, wherein the air gap exposes an upper surface of the substrate.

* * * * *